US010290455B2

(12) United States Patent
Simonin

(10) Patent No.: US 10,290,455 B2
(45) Date of Patent: May 14, 2019

(54) SELF TESTING GFCI

(71) Applicant: Carling Technologies, Inc., Plainville, CT (US)

(72) Inventor: Stephen P. Simonin, Northfield, CT (US)

(73) Assignee: Carling Technologies, Inc., Plainville, CT (US)

( * ) Notice: Subject to any disclaimer, the term of this patent is extended or adjusted under 35 U.S.C. 154(b) by 290 days.

(21) Appl. No.: 15/411,526

(22) Filed: Jan. 20, 2017

(65) Prior Publication Data

US 2017/0213680 A1    Jul. 27, 2017

Related U.S. Application Data

(60) Provisional application No. 62/286,023, filed on Jan. 22, 2016.

(51) Int. Cl.
| | |
|---|---|
| *H01H 3/04* | (2006.01) |
| *H01H 83/04* | (2006.01) |
| *H01H 71/04* | (2006.01) |
| *G01R 31/327* | (2006.01) |
| *H02H 3/33* | (2006.01) |
| *H01H 83/14* | (2006.01) |

(52) U.S. Cl.
CPC ........... *H01H 83/04* (2013.01); *G01R 31/327* (2013.01); *H01H 71/04* (2013.01); *H02H 3/335* (2013.01); *H01H 83/144* (2013.01); *H01H 2071/044* (2013.01)

(58) Field of Classification Search
USPC ...................................................... 361/42–50
See application file for complete search history.

(56) References Cited

U.S. PATENT DOCUMENTS

| | | | | |
|---|---|---|---|---|
| 8,085,516 B1 * | 12/2011 | Armstrong | ............. | H02H 3/335 |
| | | | | 361/42 |
| 9,118,174 B2 | 8/2015 | Simonin | | |
| 2007/0146947 A1 * | 6/2007 | Zhang | .................... | H02H 3/335 |
| | | | | 361/42 |
| 2014/0278157 A1 | 9/2014 | Simonin | | |

\* cited by examiner

*Primary Examiner* — Danny Nguyen
(74) *Attorney, Agent, or Firm* — Forge IP, PLLC

(57) ABSTRACT

A self-testing circuit interrupting device including Ground Fault Circuit Interrupter protection, the circuit interrupting device usable with single phase power where a test pulse is injected into a falling edge of the electrical signal at a point greater than 54.2% of the maximum amplitude of the electrical signal. The circuit interrupting device usable with dual phase power where the test pulse is injected into a falling edge of the electrical signal at 0.879 ms from a minimum amplitude of the electrical signal.

35 Claims, 11 Drawing Sheets

SELF TESTING GFCI

FIELD OF THE INVENTION

The present invention relates to a self-testing circuit interrupting device including a Ground Fault Circuit Interrupter (GFCI).

BACKGROUND OF THE INVENTION

A GFCI is a device that is capable of switching between a tripped (open) and an operative (closed) condition based on the detection of selected criteria. Specifically, a GFCI device is designed to interrupt the supply of electric power when the device detects that current is traveling along an unintended path (e.g., through a person, or through water, etc.). GFCI devices may be included in any of numerous types of components that are capable of interrupting the supply of electric power, such as arc fault interrupters, circuit breakers, electrical outlets, etc.

GFCI outlets and circuit breakers have become widely used throughout the United States and are credited with saving many lives. Although the widespread use of GFCI devices for the past thirty-plus years has led to a large number of installations, these devices are susceptible to deterioration and eventual failure. Failure of the GFCI device can lead to the device providing electrical power like any normal circuit breaker or outlet, even though the protective features that differentiate the GFCI device from conventional devices is no longer functional. This creates a dangerous situation where the GFCI device is still viewed as functional and providing life safety protection when, in fact, it is not.

Typical GFCI devices are provided with a testing feature on the face of the device. For example, for a GFCI outlet there is a "test" button and a "reset" button. When a user pushes the test button, this simulates a problem such that the outlet should toggle to a tripped or open state to interrupt the supply of electrical power to the "load" terminals and to the any device plugged into the outlet. A similar feature is provided on a GFCI circuit breaker where pressing the "test" button should interrupt the supply of electrical power to the electrical circuit that is connected to the "load" terminal of the circuit breaker. However, it has been shown that most individuals do not regularly test the GFCI outlets or circuit breakers in their homes to ensure that they are functioning correctly. Likewise, even in commercial applications, the GFCI devices are rarely tested.

This leads to the dangerous situation that GFCI devices that are currently in service are not functioning to provide the protection intended but are still in service as they continue to provide electrical power.

This potentially dangerous situation has led to the idea that GFCI devices should be self-testing which idea has been embodied in changes to the UL-943 standard in the United States. In particular, the concept of self-testing is to occur automatically and if a device is found to be defective there should be a warning to that effect that indicates the state of the device to personnel. A challenge faced by manufacturers is how to perform the self-testing automatically without impacting the normal function and the operation of the GFCI device. In other words, the GFCI device must be tested on a regular basis to determine if it is still operational, however, this self-testing cannot interfere with the tripping of the GFCI device in the event that an actual ground fault occurred.

Since June 2015, the UL-943 standard requires manufacturers to provide GFCI devices with a self-test function that automatically performs an internal test to ensure the GFCI is still functional and can properly trip during a ground fault condition. If, during the self-test, it is determined that the GFCI device is no longer functional, the device must either deny power or provide a visual and/or audible indication that the device is no longer functioning properly.

In the move from manual tested to self-testing GFCI devices, many manufacturers have sought to utilize digital technology to facilitate the self-testing functionality. However, a major problem with previously known designs is that they suffer from nuisance tripping.

U.S. Pat. No. 9,118,174 ("the '174 patent") is directed toward a system that seeks to provide a self-testing GFCI by use of voltage level comparison and indirect sampling. In particular, the '174 patent uses a microprocessor in conjunction with a software program to perform an automatic self-test. The '174 patent uses a driver that receives a signal from the microprocessor to inject a test signal indicative of a ground fault when the self-test is performed. The '174 patent seeks to perform the automatic self-test function without interfering with the GFCI functionality and not causing false trips. This is done by looking at a value of the power indication signal generated by the fault detection circuit. However, a major drawback to the design of the '174 patent relates to the methodology of injecting the test pulse into the device.

A challenge that manufacturers face is how to inject the test pulse into the device without interfering with other signals present in the device. For example, in a GFCI circuit, there are areas of the half wave that should be avoided for the self-test signal injection. For example, if the half wave is broken into four quadrants, the GFCI charging cap occurs typically during the middle part of the second quadrant (e.g., during the rising edge but before the peak amplitude is reached). To avoid interference, the '174 teaches use of internal timers and measures a rising edge, which once a threshold level is reached, starts the timer such that the self-test signal is then injected into the half wave during the fourth quadrant (e.g., during the falling edge but before the peak reaches zero). This method is relatively effective in avoiding the charging cap in the second quadrant, however, as the signal is shifted relatively late in the fourth quadrant, there is the propensity that interference could occur with the next half wave. Likewise, the system taught in the '174 that uses the timing concept is only useable for single phase operation.

SUMMARY OF THE INVENTION

Accordingly, it is desired to provide a self-testing GFCI device that complies with UL-943 while simultaneously reducing the number of instances of nuisance tripping.

It is further desired to provide a self-testing GFCI device that is useable in a single phase application and effectively eliminates potential interference with the self-test signal to avoid nuisance tripping.

It is still further desired to provide a self-testing GFCI device that is useable in a two phase application and effectively eliminates potential interference with the self-test signal to avoid nuisance tripping.

These and other objects are achieved in one configuration where a GFCI device is provided in which, rather than using internal timers for determining when to inject the test signal in single phase circuits, a measurement of the falling edge pulse is taken so that the self-test signal is injected at a point above the 50% amplitude on the falling edge. In one configuration, the self-test signal is ideally injected at 54.2% of the maximum amplitude on the falling edge. This typically will correspond to approximately 2.6V with a single phase power device. It will be noted by those of skill in the art that this amplitude level will effectively place the self-test signal injection point at a point in the latter part of the third quadrant.

This methodology provides a number of distinct advantages over prior systems. First, the signal injection is based on an amplitude measurement rather than solely on a timing signal generated by an internal timer. This means that there is no need for the specific timing circuitry configuration that is required by the prior art devices. Additionally, rather than approximating when the self-test signal should be injected based upon a measurement on the rising edge, the system makes an exact measurement and injects the self-test signal exactly where it is desired (i.e., where it will potentially receive the least interference). The system is also less sensitive to variations in the frequency of the supplied power as the signal is injected at the exact measured amplitude rather than an approximation of the amplitude based on a timing signal where amplitude can vary in time depending on the frequency of the actual supplied power.

According to another aspect of the invention a Programmable System on Chip (PSoC) is used. The PSoC includes analog, digital and a microprocessor controller. In particular, the PSoC generates a test pulse to the sense coil and reads the output from the GFCI to verify the system is operational. The on time duration ON and position in time of the self-test pulse is closely controlled to not interfere with the active region of the controller leakage area. The PSoC is provided with a digital portion to initiate the self-test on the falling edge without any timers, which is based on the analog voltage divider of main power and a PSoC comparator.

In another configuration, the PSoC also controls an LED for generating an alarm indication. The PSoC may be programmed to change the time duration of Alarm ON and time to trip depending on fault conditions.

In looking at the GFCI device, there is a provision for a GFCI Supervisory Circuit, which provides manual test for ability to trip due to a simulated ground fault by creating a current imbalance of a sensing toroid. Current imbalance is sufficient to cause tripping at 85% of rated voltage.

The GFCI device may further provide for End of Life indication, where the GFCI is incapable of providing ground fault protection and passing its internal test function. End of Life feedback may cause repeated tripping and/or visual indication.

In another configuration, the GFCI device may further provide for GFCI Auto-Monitoring Testing, which is performed without opening the circuit breaker contacts or compromising the ability to respond to ground or neutral faults. The test is performed every time power is supplied within 5 seconds. The test frequency is selected to be compliant with UL-943. The feedback when the auto-monitoring test fails may include repeated tripping and/or visual indication.

For this application the following terms and definitions shall apply:

The term "network" as used herein includes both networks and internetworks of all kinds, including the Internet, and is not limited to any particular network or inter-network.

The terms "coupled", "coupled to", "coupled with", "connected", "connected to", and "connected with" as used herein each mean a relationship between or among two or more devices, apparatus, files, programs, applications, media, components, networks, systems, subsystems, and/or means, constituting any one or more of (a) a connection, whether direct or through one or more other devices, apparatus, files, programs, applications, media, components, networks, systems, subsystems, or means, (b) a communications relationship, whether direct or through one or more other devices, apparatus, files, programs, applications, media, components, networks, systems, subsystems, or means, and/or (c) a functional relationship in which the operation of any one or more devices, apparatus, files, programs, applications, media, components, networks, systems, subsystems, or means depends, in whole or in part, on the operation of any one or more others thereof.

In one aspect of the invention a circuit interrupter is provided comprising a line terminal configured to be connected to a power source to provide electrical power, a load terminal configured to be connected to a load and an interrupter coupled between the line terminal and the load terminal, the interrupter having an open and a closed condition, wherein the interrupter electrically connects the line terminal to the load terminal in the closed condition and electrically disconnects the line terminal from the load terminal in the open condition. The circuit interrupting device further comprises a fault detector configured to detect a fault in an electrical signal in the interrupter, wherein when a fault is detected the interrupter is placed in the open condition and a test device electrically connected to the fault detector and the interrupter, the test device generating a test signal that is designed to determine if the fault detector is functioning properly. The circuit interrupting device is configured such that the test device monitors the electrical signal in the interrupter such that the test signal is injected into the electrical signal on a falling edge of the electrical signal and at a point above 50% of a maximum amplitude of the electrical signal.

In another aspect of the invention a circuit interrupter is provided comprising a line terminal including two power connections to be connected to a power source to provide electrical power, where the electrical power provided to the line terminal comprises dual phase power, and a load terminal configured to be connected to a load. The circuit interrupter further comprises an interrupter coupled between the line terminal and the load terminal, the interrupter having an open and a closed condition, wherein the interrupter electrically connects the line terminal to the load terminal in the closed condition and electrically disconnects the line terminal from the load terminal in the open condition. The circuit interrupter still further comprises a fault detector configured to detect a fault in an electrical signal in the interrupter, wherein, when a fault is detected, the interrupter is placed in the open condition and a test device electrically connected to the fault detector and the interrupter generates a test signal that is designed to determine if the fault detector is functioning properly. The circuit interrupter is configured such that the test device monitors the electrical signal in the interrupter such that the test signal is injected into the electrical signal on a falling edge of the electrical signal and at approximately 2.6V and in a range of from 0.8 ms to 0.9 ms from a minimum amplitude of the electrical signal.

In another configuration, the test signal is injected into the electrical signal on a falling edge of the electrical signal and at approximately 2.64V and at approximately 0.879 ms from a minimum amplitude of the electrical signal.

Other objects of the invention and its particular features and advantages will become more apparent from consideration of the following drawings and accompanying detailed description.

DETAILED DESCRIPTION OF THE INVENTION

Figure 1A:
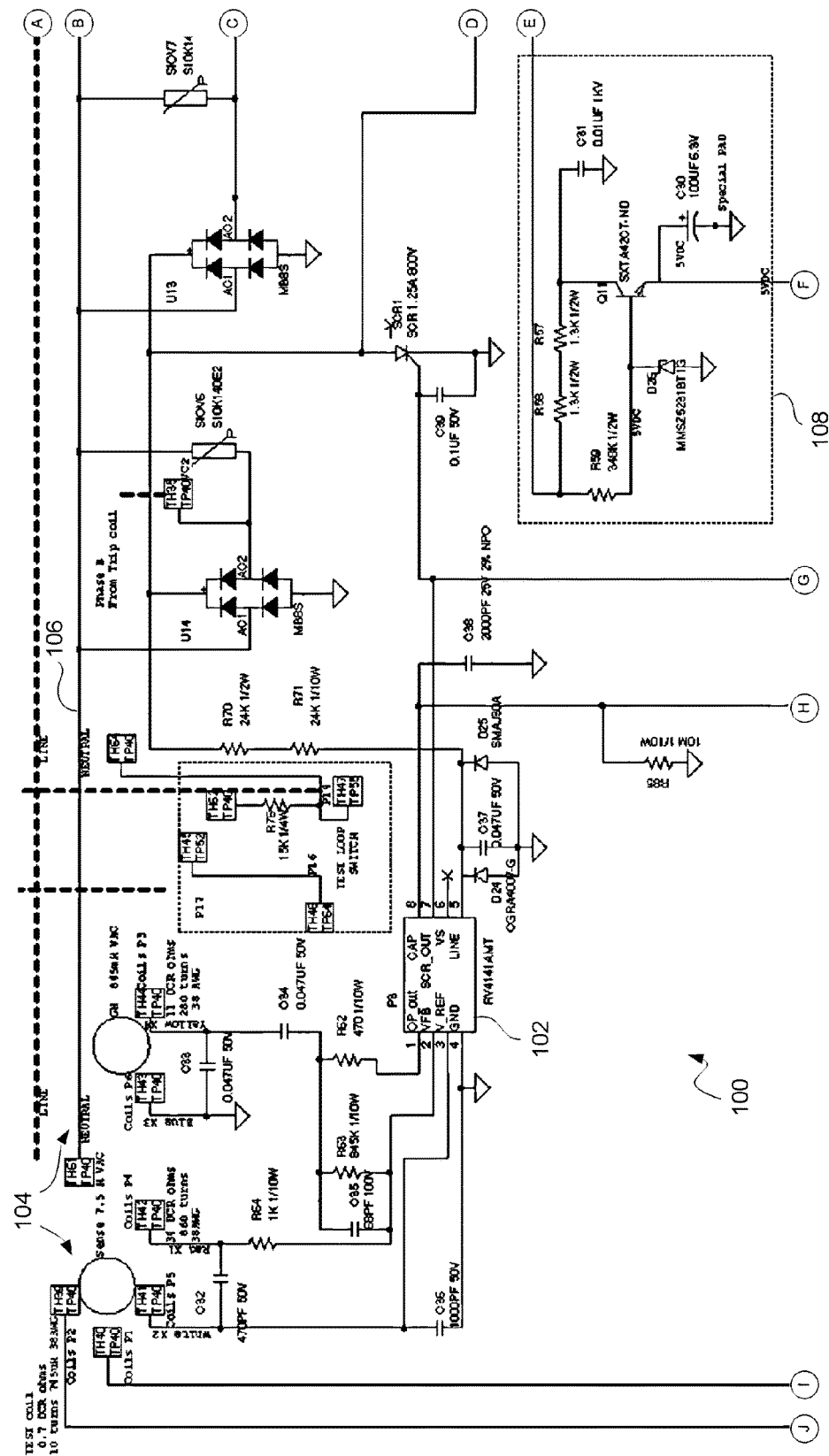
FIG. 1A-1C is a schematic diagram of one exemplary configuration for a circuit interrupter according to the present invention.

Referring now to the drawings, wherein like reference numerals designate corresponding structure throughout the views.

Figure 1B:
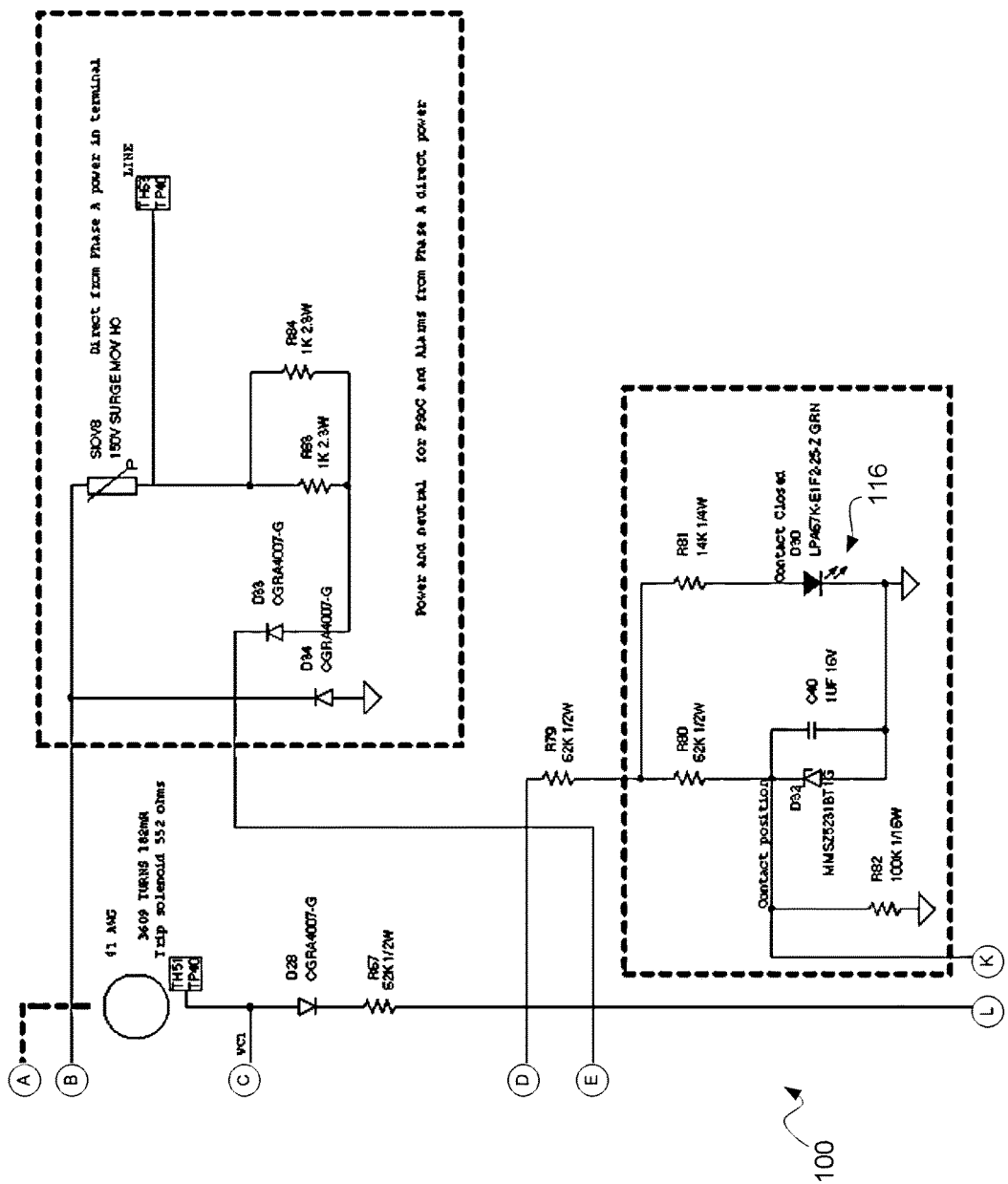
Figure 1C:
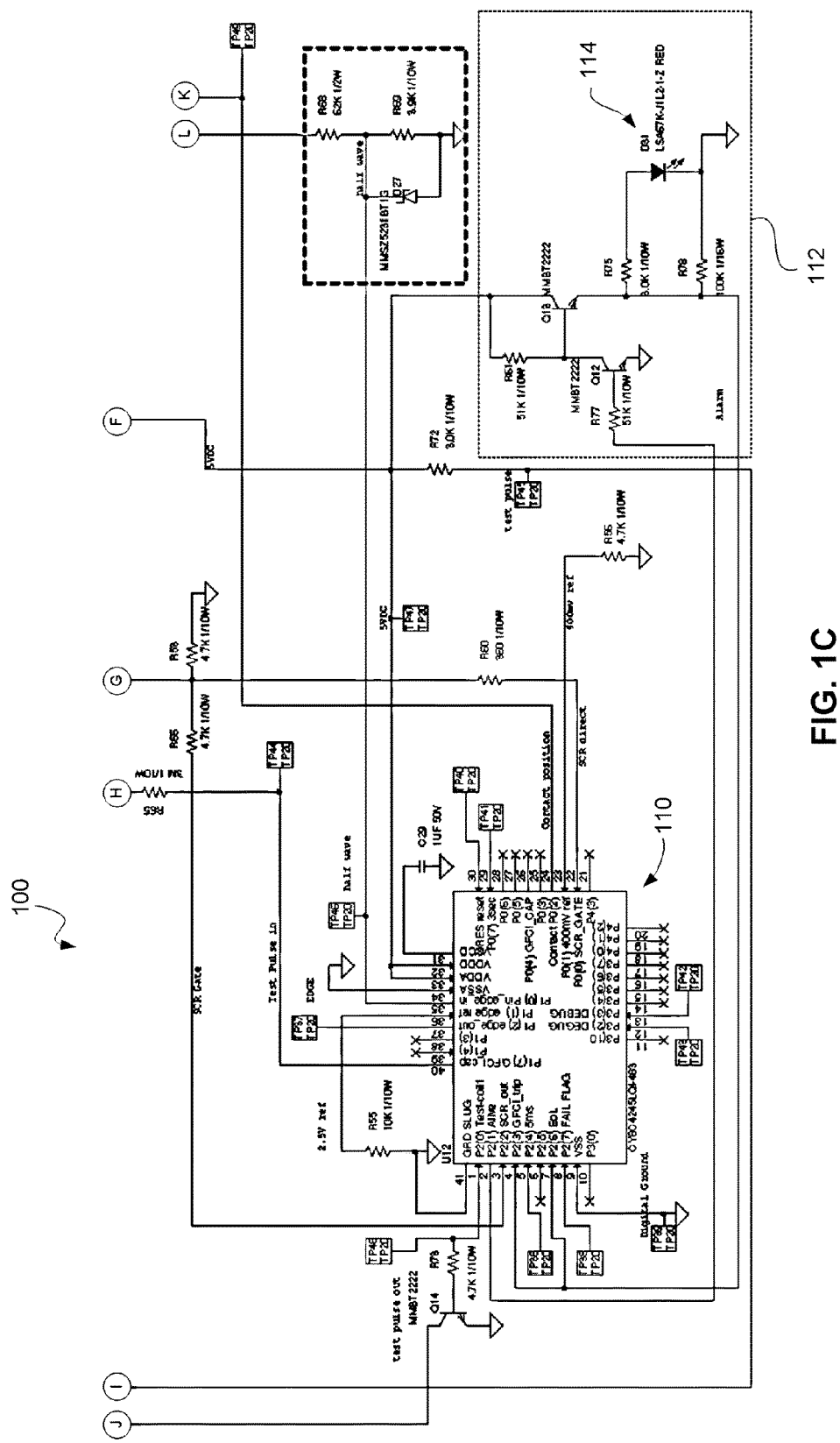

Referring now to FIGS. 1A-1C a schematic diagram illustrating a circuit configuration of the circuit interrupter 100. The schematic diagram is provided into three parts on FIGS. 1A through 1C where the circles with letters indicate circuit connections between FIGS. For example, on the right hand side of FIG. 1A the designations A-E are each shown inside a circle. The corresponding connections for designations A-E are shown on the left hand side of FIG. 1B where "A" in FIG. 1A is a connection to "A" in FIG. 1B and so on. Likewise, FIG. 1A shows designations F-J on the bottom of the page and corresponding designations F-J are shown at the top of FIG. 1C indicating the circuit connections. Finally, the designations K-L are shown at the bottom of FIG. 1B with corresponding designation K-L shown at the top of FIG. 1C indicating the circuit connections.

A description of the general operation of the GFCI will be presented. The circuit interrupter 100 includes trip thresholds, which when reached, will cause the device to toggle to an open condition in which electrical power provided on the line terminal will not be passed to the load terminal, which would include the socket for a GFCI electrical outlet.

Leakage is defined as the amount of current imbalance that is measured as a net result of out-bound and returning current from the load side. This would include, for example, measuring the amount of current outbound to a device plugged into a GFCI electrical outlet, and measuring the amount returning on the neutral connection. If there is leakage such that the amount returning is less than the amount out-bound, this difference is the leakage current. Similarly, for devices that are connected to the load terminal (e.g., other electrical outlets that are "fed" from the circuit interrupter 100) the amount of out-bound current to these devices is compared to the returning current on the neutral connection to measure leakage.

A normally operating circuit will have zero current differential when measuring out-bound compared to return current. This would generate zero pick up on the GFCI amplifier. The trip (or opening) window is typically between 4 mA and 6 mA.

A grounded neutral provides a closed loop between the "safety" ground connection and the neutral connection on the load side of the circuit interrupter, thereby providing a closed loop with the electrical distribution panel side. In particular, a grounded neutral is a condition that occurs when the neutral and safety ground wires are connected on the load side of the circuit breaker. This introduces a safety issue in that the two paths are no longer separated and cannot provided the needed safety separation. For example, return current is now able to flow through the safety ground, which is highly undesirable.

Figure 2:
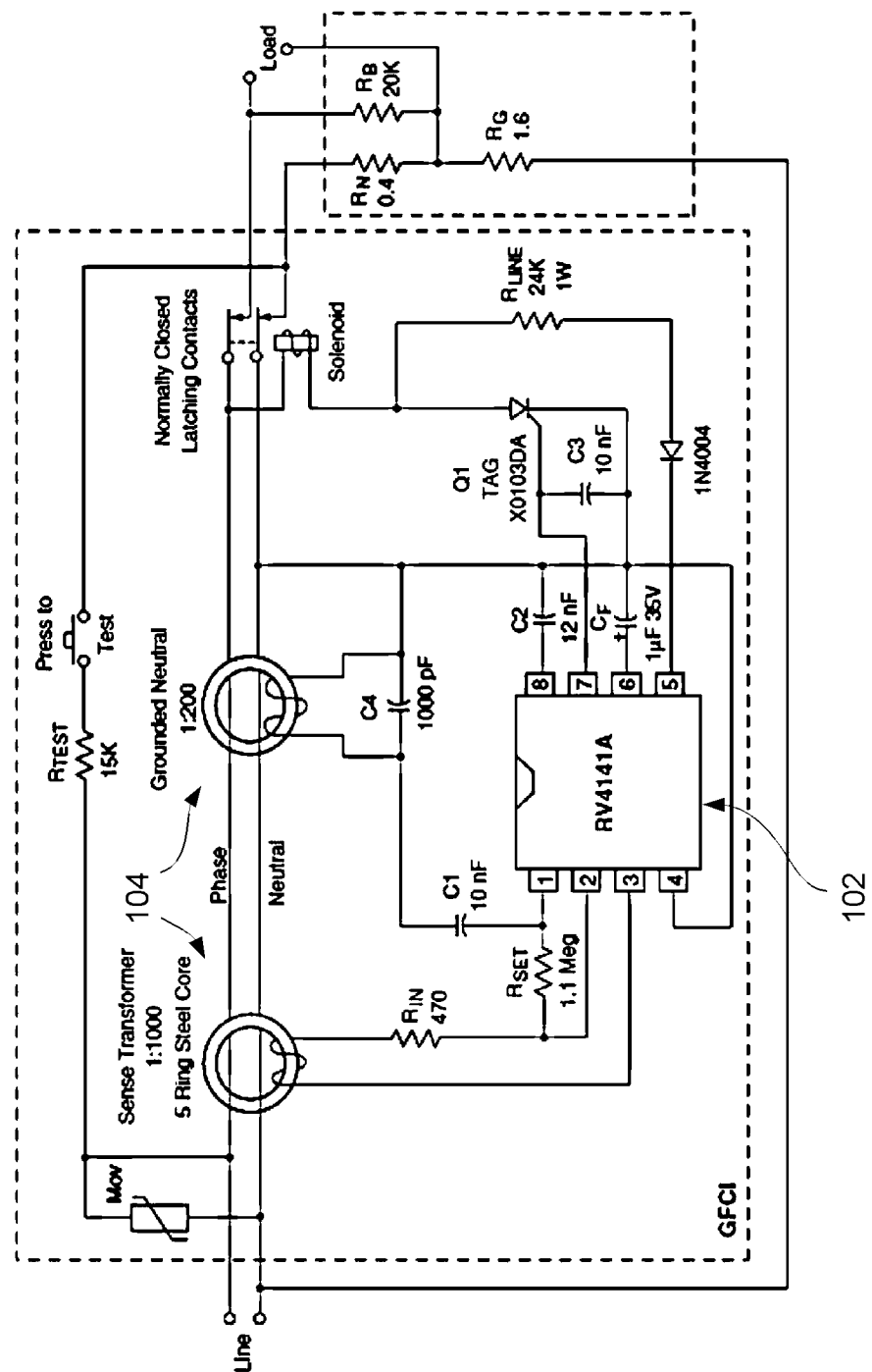
FIG. 2 is a schematic diagram of a self-testing GFCI circuit according to FIG. 1A.

In FIG. 1A it can be seen that a 4141 Fairchild chip is depicted, which comprises fault detector 102 (a more detailed view is shown in FIG. 2). Fault detector 102 picks up current imbalances on the sense core 104 that is shown in the top left of FIG. 1A. The grounded neutral core 106 is provided to inject a frequency to the sense core 104 when the two cores are coupled by a ground loop (e.g., a grounded neutral). The grounded neutral interrupt is designed to detect and start tripping at about 2.5Ω in the closed loop. This is based off the resistance of the wires in a 100 foot run from the breaker and return. This is activated by setting up a standing frequency in the GN coil that will be picked up by the loop and couple onto the sense coil that will amplify the GN coil as the signal strength rises above 2.5Ω.

Also illustrated in FIG. 1A is a 5V DC regulator 108 that provides electrical power to the circuit.

In FIG. 10 the PSoC Programmable System on Chip (PSoC) 110 is shown. The PSoC 110 includes an analog, a digital and a microprocessor controller. In operation, PSoC 110 generates a test pulse to the sense coil and reads the output from the GFCI to verify the system is operational. It should be understood that the self-test pulse is carefully controlled on time duration ON and in position in time to not interfere with the active region of the 4141 leakage area.

In addition to controlling the self-test pulse, the PSoC 110 also controls alarm module 112 that includes an LED 114 (red color) for indicating an alarm condition. The PSoC 110 is programmable such that the time duration of Alarm ON and the time to trip may be adjusted depending on specific fault conditions. It should be understood that alarm module 112 may be provided as an independent module and may allow for remote monitoring signal access.

With respect to the functioning of the visual indications—LED 114 (red) and LED 116 (green)—during normal operation with the contacts closed and power on, LED 116 (green) will be lit. LED 114 (red) indicates the system status. The following are a listing of Events with a following description of the system response and function Event is: GFCI leakage threshold SCR Gate P0(0) on PSoC 110 is above 200 mV. The LED ON time=Stays ON until fault is cleared and contacts are closed, which is controlled by GFCI_trip P2(3) Open drain High ON and the SCR fire for the same amount of time.

Event is: Failed GFCI chip P1(7) no test pulses from GFCI charging cap. The LED ON time=After 3 consecutive 3 second tests, 6 seconds Ramping intensity ON Fast Flash, stays ON until CB power OFF, which is controlled by EoL P2(6) Open drain High ON and the SCR fires after the 6 seconds LED Flashes ON completes SCR ON for 150 µs at edge detected every 6 seconds until trip.

Event is: PSoC power ON/OFF. The LED ON time=PSoC sends out a constant 5V while software is running and powered RED LED until power OFF PSoC, which is controlled by P2(1) Alive Open drain High ON and there is No PSoC SCR events as PSoC not functional, note: GFCI still functional.

Event is: PSoC ON and testing operational. The LED ON time=ON 2 ms (this is the alive pulse or "heart beat") at 3 second interrupts, which is controlled by EoL P2(6) Open drain High ON and there is no SCR firing as this is a normal powered ON confirmation pulse. The heart beat follows the test pulse and sits just before the negative transition In one configuration, PSoC 110 is programmable in circuit on the card. Likewise, Test Points ("TP_") are variously indicated on the schematic diagram and are provided for operation verification and fault finding if needed. It will be understood by those of skill in that art that the circuit interrupter circuitry as illustrated in FIGS. 1A-1C and 2, can be provided on a Printed Circuit Board (PCB).

In another configuration, the PCB may be programmed directly via 5 pins identified as Program MiniProg3—a Cypress program connected USB. The development Creator programmer or the simpler HEX file loader using MiNProg3 can be used.

With reference to FIGS. 1A-1C, PCB testing can be performed as described herein. TP39 may be used for reference of all signals except TH57 & TH59, which require external power. A three second timer used to produce a test pulse is brought out on a test point uses an external 5V DC power supply. A 3 second 5V pulse should always be able to be detected.

A Fail Flag can be detected by shorting out TH40 and TH39 test pulse on the sense coil, where 3 in a row is designed to cause End of Life (EoL) (TH57 & 59) for 6 seconds followed by the SCR firing and removing power from the PCB.

The following screen shot are presented to further illustrate and explain the present invention. All measurements were conducted using industry standard test methods.

Figure 3:
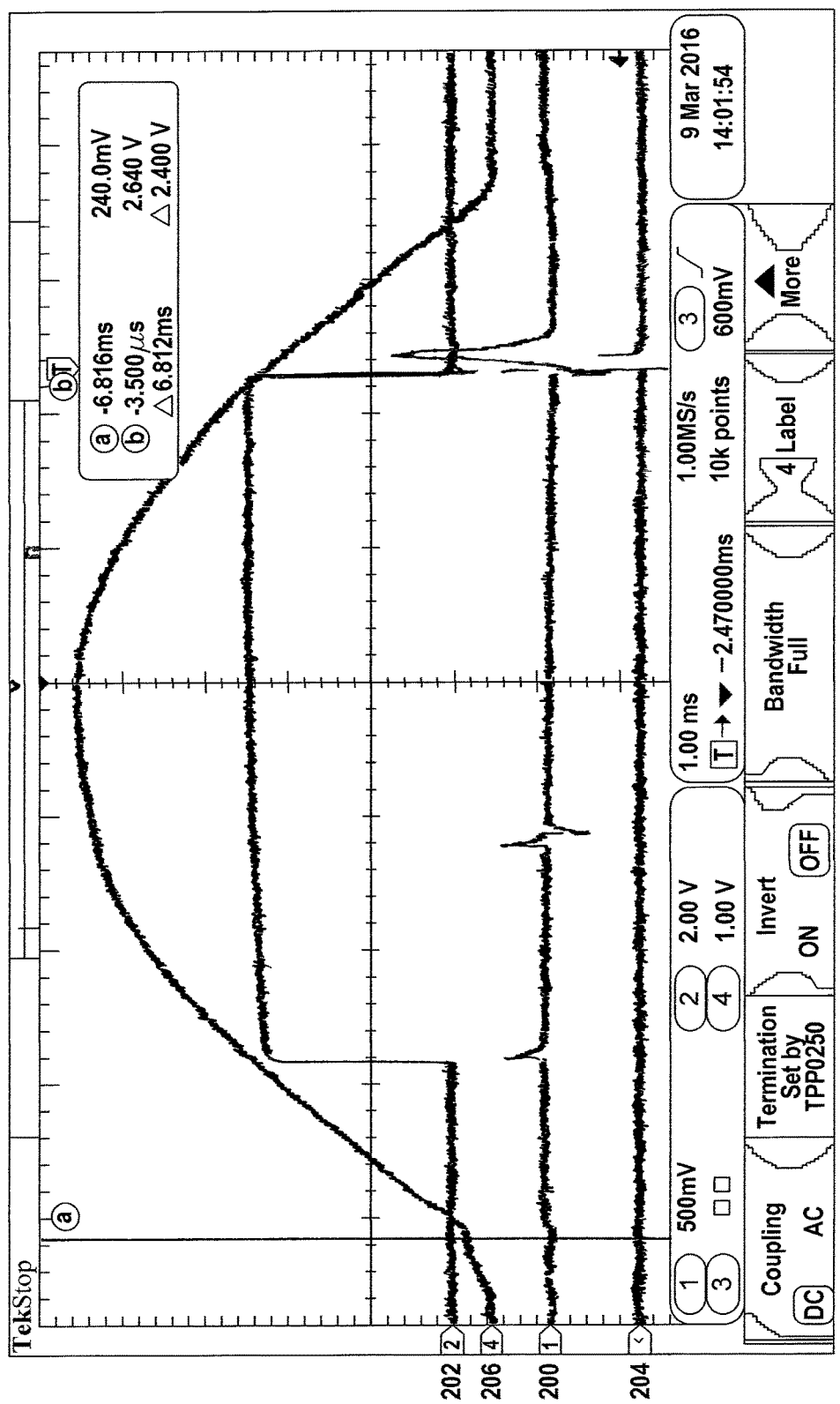
FIGS. 3-8 are various screen shots of electrical signals according to the circuit interrupter of FIGS. 1A-1C.
Figure 4:
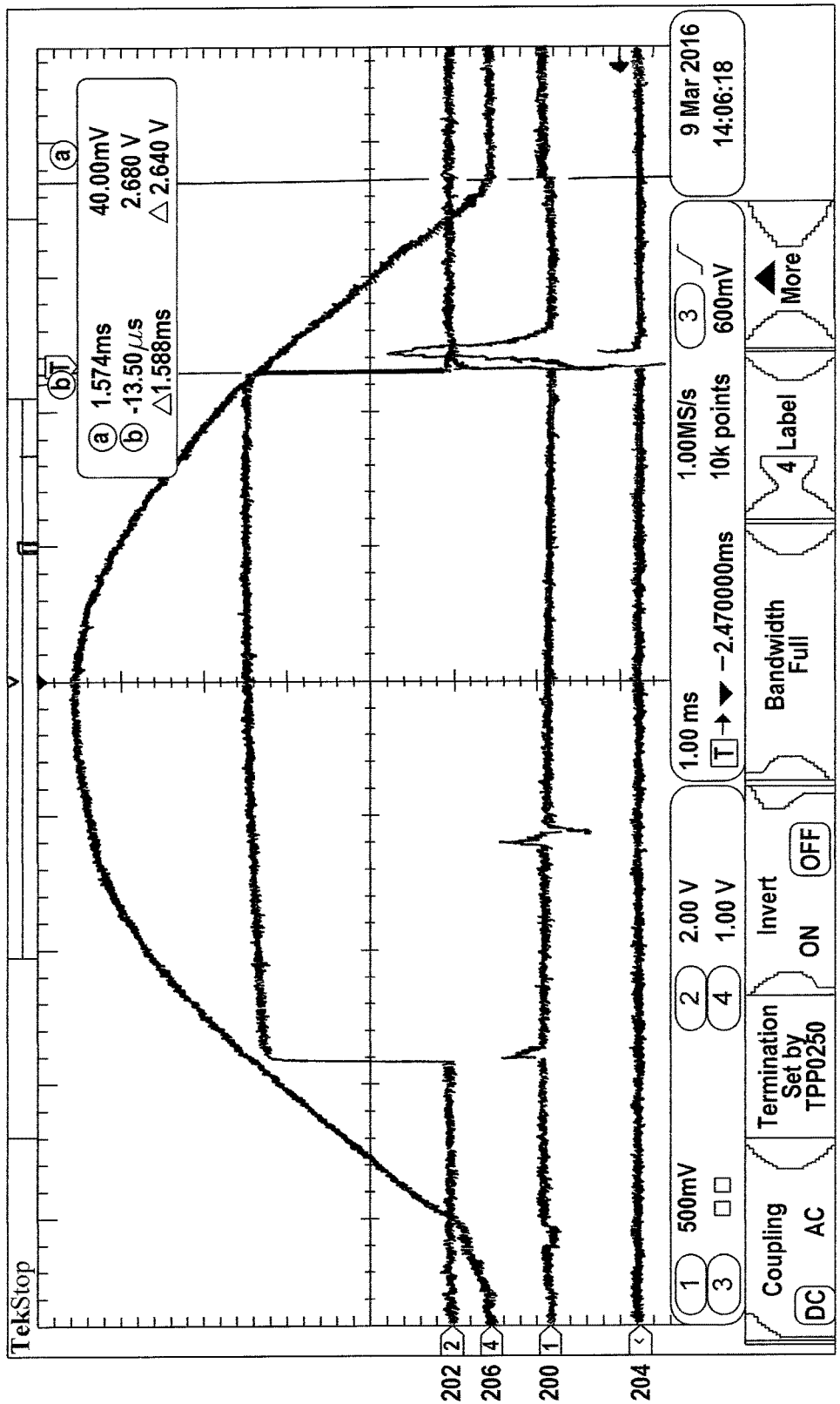

In function where reference is made to FIGS. 3 & 4, line "1" (200) is the GFCI charging cap, line "2" (202) is a 5V square wave output, line "3" (204) is the test coil output, and line "4" (206) is the ½ wave reference.

In reference to FIG. 3, a 5 ms pulse line 1 (200) will be seen at about 2 ms (in particular, at 2.6 ms) from the rising edge of power. Test Coil TP48 will be 5V GFCI power grounded for 100 µs during the test pulse. The 5 VDC coil will be a 5V positive at 100 µs long during the coil test. The GFCI cap is the charging signal seen from the GFCI after the test pulse.

Line 2 (202) Edge 50% is a 5V square wave created at the positive power half wave line 4 (206) passing 50% points. Edge detection occurring at 2.6V will typically be at about 1.36 ms from the zero crossing.

In FIG. 3, the falling edge of the interrupt occurs at 6.8 ms from zero crossing. In FIG. 4, the test pulse is controlled by the falling edge at 2.6V (1.588 ms) from the zero crossing for single phase power applications. The test pulse is applied on the falling edge at approximately above the 50% signal level in single phase configurations. In particular, it can be observed that the test pulse is injected at 54.2% of the signal level on the falling edge.

In function where reference is made to FIGS. 3 & 4, line "1" (200) is the GFCI charging cap, line "2" (202) is a 5V square wave output, line "3" (204) is the test coil output, and line "4" (206) is the ½ wave reference.

Figure 5:
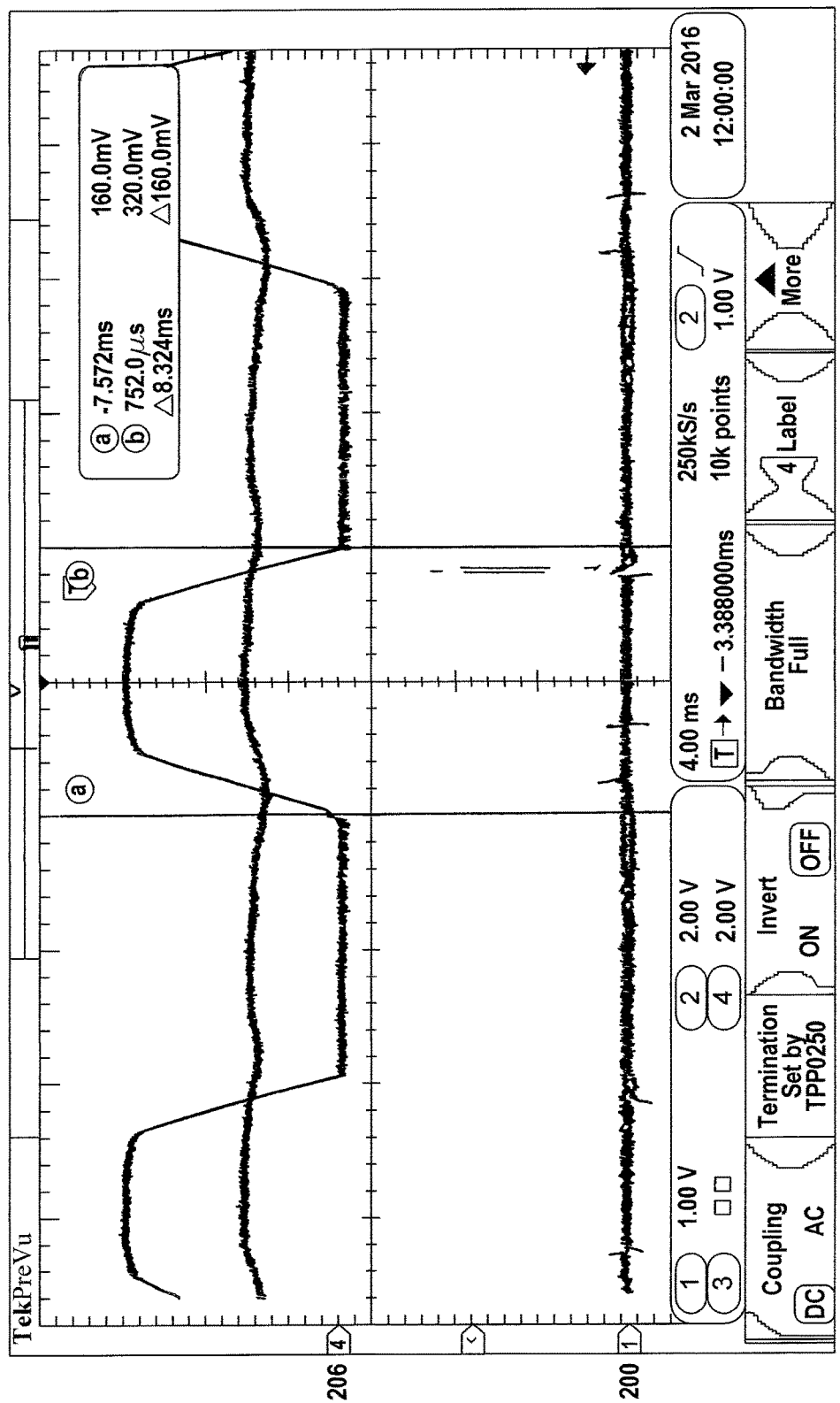
Figure 6:
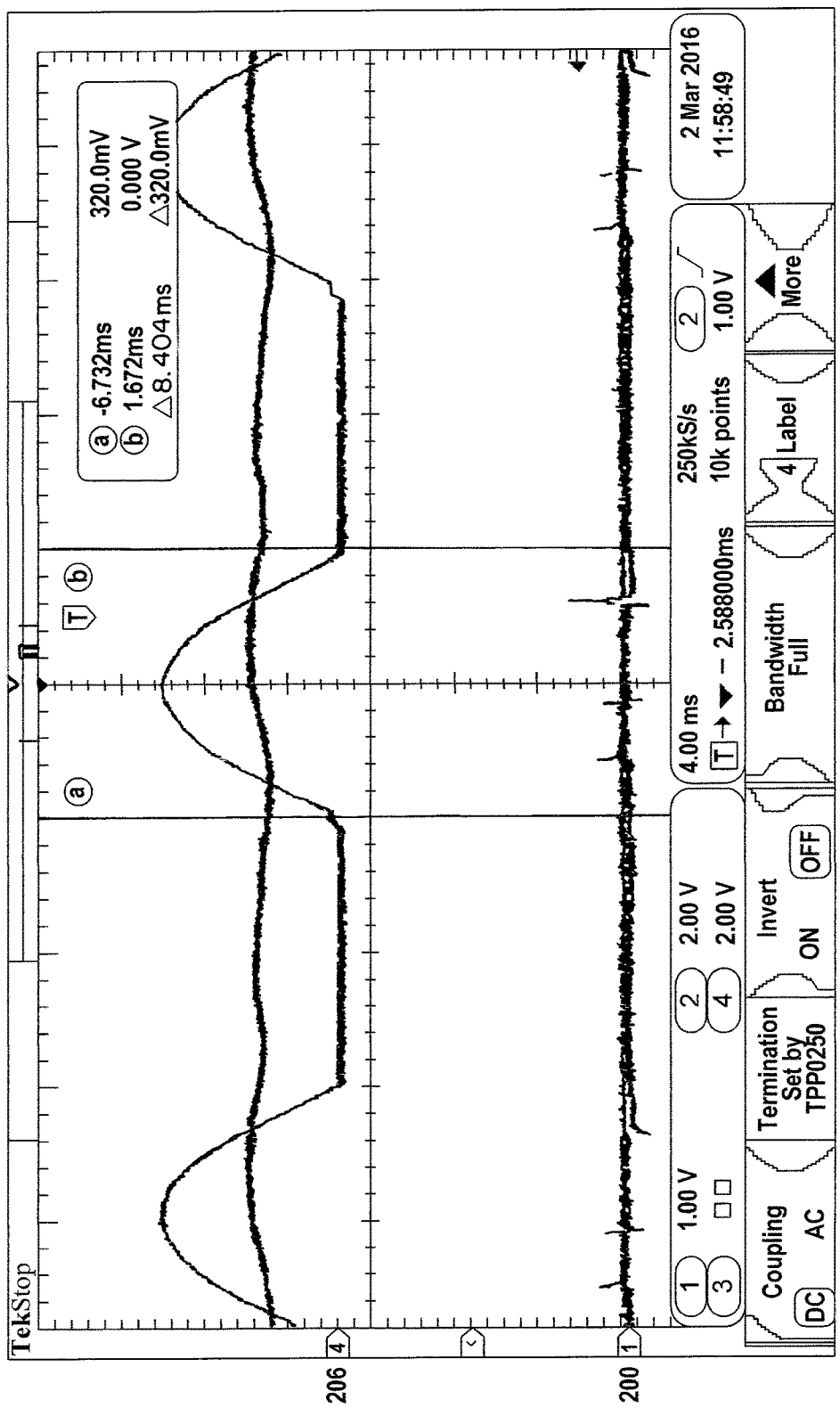
Figure 7:
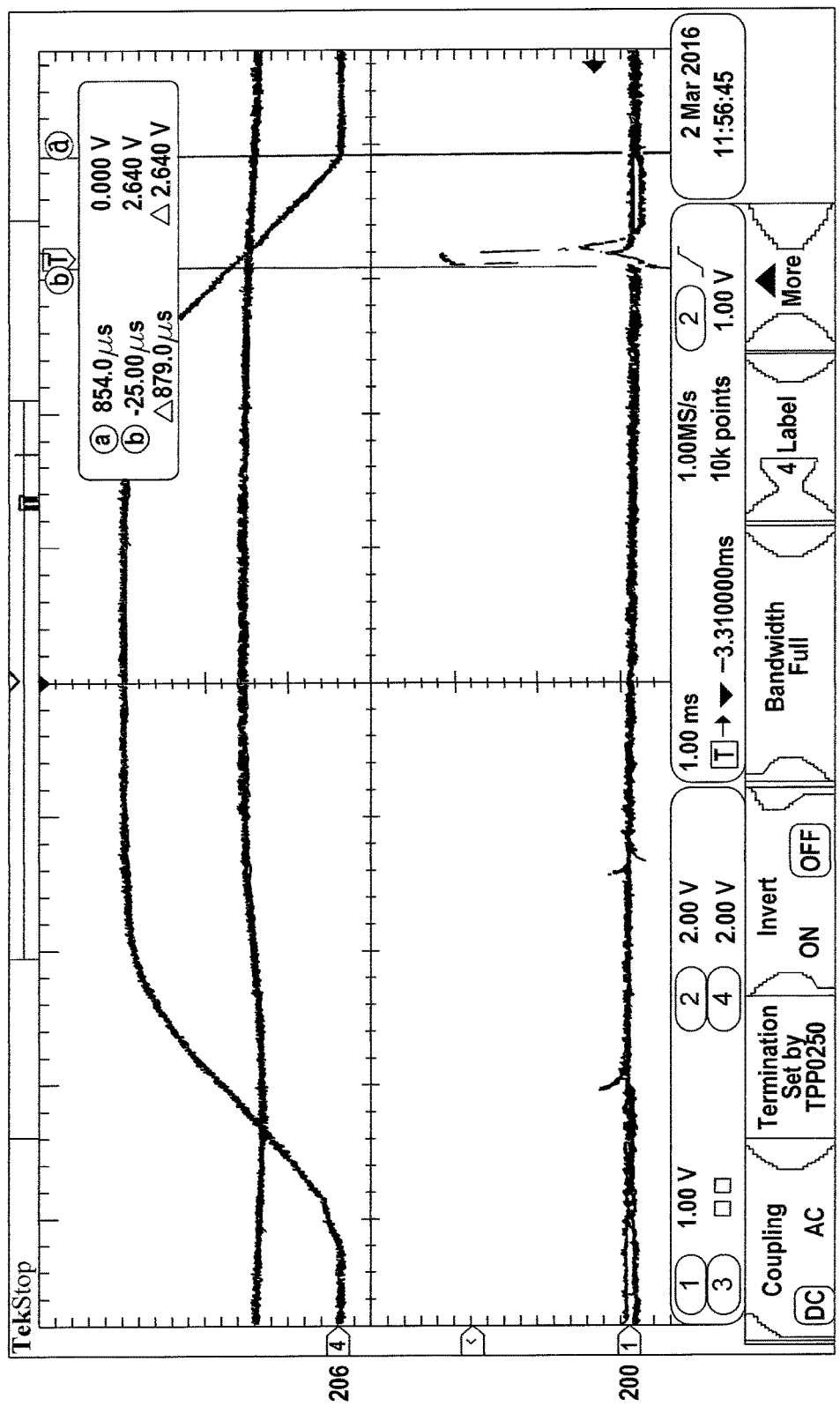
Figure 8:
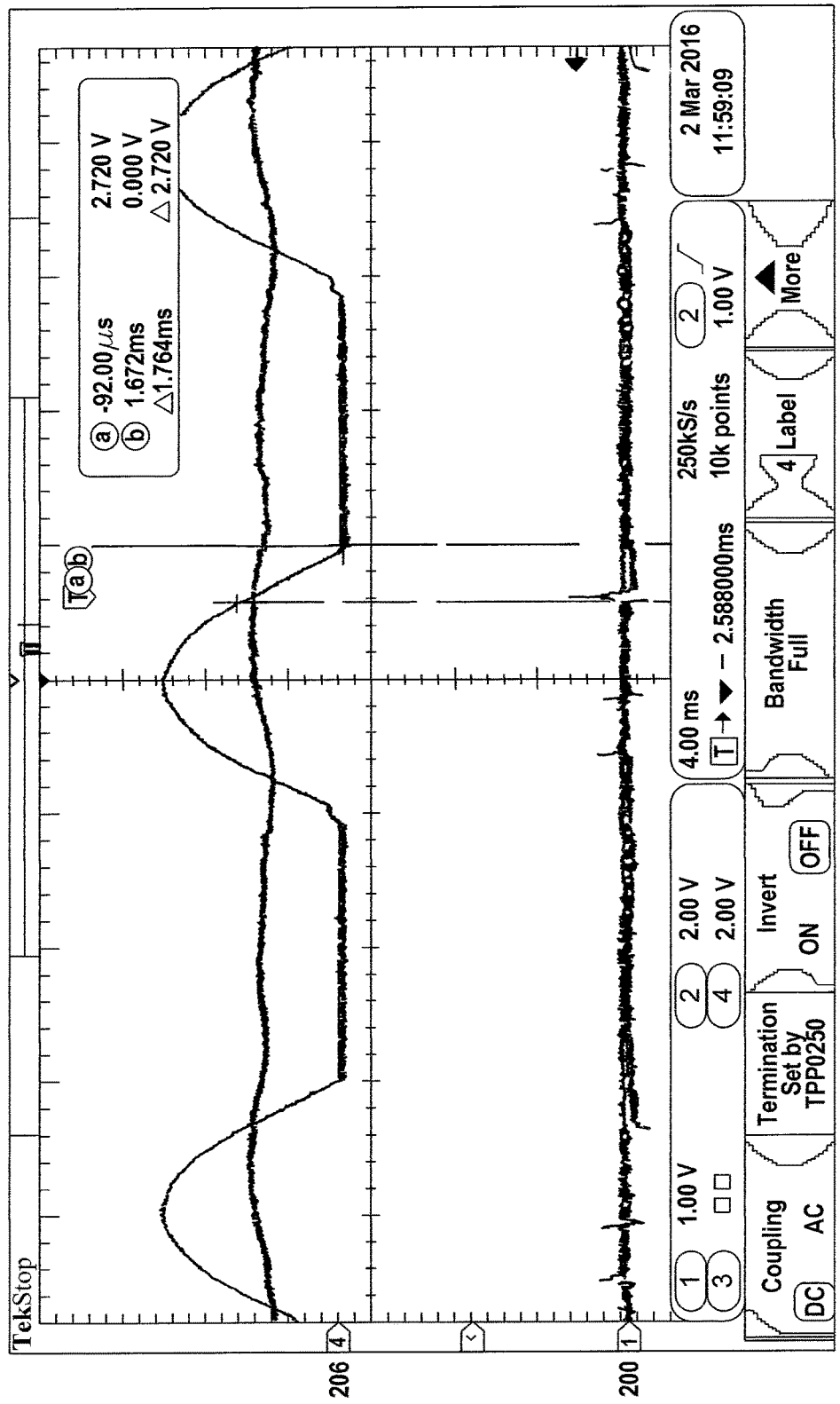

Referring now to FIGS. 5-8, line "1" (200) is the GFCI charging cap and line "4" (206) is the ½ wave reference. FIG. 5 shows a dual power mode which includes a 8.32 ms ½ wave width, and FIG. 6 shows single phase powered which includes a 8.3 ms ½ width. The only difference shown is the rise time. FIG. 7 shows the pulse to edge in a dual phase application at 0.879 ms from the edge just before it kicks over; while FIG. 8 shows the pulse to edge in a single phase application at 1.6 ms. It should be noted that in dual phase operation, it is advantageous to indicate the 50% amplitude point on the hysteresis curve on the leading edge. This provides for built in error prevention for applications in noisy environments with many inductive loads.

The following is a sequence for the GFCI self-test auto monitoring basic functions. It should be noted that, while various functions and methods will be presented in a sequence of steps, the sequence has been provided merely as an illustration of one possible sequence, and that it is not necessary to perform these functions in the specific order illustrated. It is further contemplated that any of these steps may be moved and/or combined relative to any of the other steps. In addition, it is still further contemplated that it may be advantageous, depending upon the application, to utilize all or any portion of the functions described herein.

First, verify PSoC operational, if not, then alarm is immediately set.

Next, test GFCI circuit within 5 seconds of power up and once every 3 seconds including:

1. Read voltage level in active region of GFCI 1st.
2. If signal is present, then skip the test pulse.
3. Is signal over max level for 3 consecutive tests? If so, this indicates a failed SCR. EoL alarm is set to ON, and fire SCR 20 ms every 3 seconds until power OFF.
4. Send out a test pulse to sense coil and read charging level.
5. If the signal level is above the threshold, then continue testing.
6. If the signal level is below the threshold, then set Fail Flag (output TP38) and count down from 3 to zero if contiguous.
7. If a valid test returns before zero count, reset counter.
8. If the counter hits zero, turn on EoL alarm for 6 seconds followed by firing the SCR once every 6 seconds until power OFF.
9. Test and verify that the power is between 48 Hz to 68 Hz to allow test pulses within 50 Hz and 50 Hz operation. In practice, the GFCI can operate within from 30 Hz to 70 Hz, the trip coil, however, will need adjustments to meet those ranges.
10. Detect the 50% rise point of power.
11. Provide 3 second timer for test pulses.
12. Provide an RED LED ON alarm with each GFCI trip to Load power off. PSoC stays ON.
13. Provide a 2 ms flash on each test completion for active heartbeat indication.
14. Provide a Green LED indicator when contacts are closed and power present.
15. Provide a RED LED to indicate Heart Beat and EoL flashing.
16. Detection of Contacts open and closed. Self-Test stopped if contacts are OPEN.
17. Breaker will restart and test on power up and if an EoL condition is present, set alarm then trip.

Figure 9:
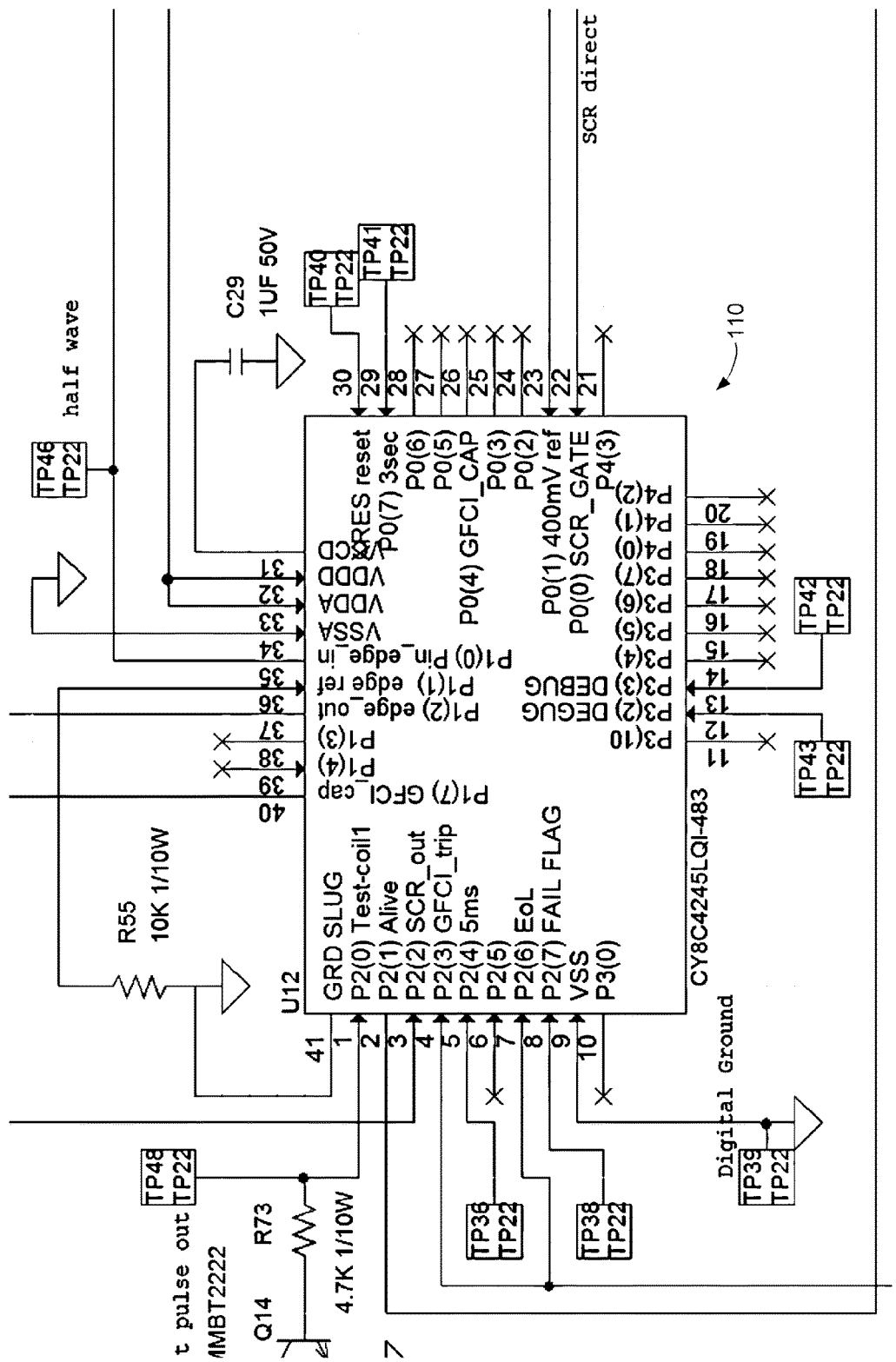
FIG. 9 is a schematic diagram of an exemplary configuration for the circuit interrupter of the present invention according to FIG. 1C.

Referring now to FIG. 9 where PSoC 110 is described in more detail. This is the PSoC monitor and power denial section. The following description provides a detailed description of the pin configurations, which is used with reference to FIGS. 1A-1C.

Pin1, P2(0) Q3 provides output 5V, test pulse 70 usec once per 3 seconds.

Pin40, P1(7) GFCI_CAP inputs to a follower with 1 µA results of test pulse. Level normal <800 mV (at fail EoL may reach 5.5V unit will be at end of life at that point).

Pin35, P1(0) half wave is 0 to 5V into the comparator.

Pin36, P1(1) is 2.5V reference into the comparator.

GFCI trip alarm input P0(0) 0 to 560 mv—tripped, P0(1) 400 mv threshold, open gate=3.4V max.

Pin4, P2(3) provides 5V output from LHcomp to Control register ON as long as the 4141 pin7 fires (10 msec) off (3K load=1.6 mA).

Pin7, P2(6) provides EoL alarm output ON for 6 sec but SCR fire output and power off (6 second ON 3K load=1.6 mA).

Pin2, P2(1) input goes to 5V while power ON.

Pin3, P2(2) Output drives SCR Gate ON 150 μsec once per 6 second EoL (1 mA) (If mains edge fails this output is ON for 20 msec once per 3 sec.).

Pin12, P3(2) is programmer 10 data.

Pin13, P3(3) is Programmer clock.

Pin22, P0(0) SCR GATE in 0 to 540 mV normal operation, 3.6V in fail state.

Pin23, P0(1) 400 mV reference for SCR Gate threshold trip to control register pin4.

Pin30, is reset.

Pin33, VDDA is analog 4.8 VDC.

Pin32, VDDD is digital 4.8 VDC.

Pin31, VCCD is digital internal ref to 1 μF cap.

Pin34, VSSA is analog ground.

Pin9, VSS is digital ground.

Pin5, P2(4) is 5 msec Test Point (TP).

Pin37, P1(2) is 50% TP edge.

Pin8, P2(7) is Fail Flag pulse TP.

Pin29, P0(7) is 3 second clock TP.

Pin24, P0(2) is contact position.

Although the invention has been described with reference to a particular arrangement of parts, features and the like, these are not intended to exhaust all possible arrangements or features, and indeed many other modifications and variations will be ascertainable to those of skill in the art.

What is claimed is:

1. A circuit interrupting device comprising:
   a line terminal configured to be connected to a power source to provide an electrical power;
   a load terminal configured to be connected to a load;
   an interrupter coupled between said line terminal and said load terminal, said interrupter having an open and a closed condition, wherein said interrupter electrically connects said line terminal to said load terminal in the closed condition and electrically disconnects said line terminal from said load terminal in the open condition;
   a fault detector configured to detect a fault in an electrical signal in said interrupter, wherein when a fault is detected said interrupter is placed in the open condition; and
   a test device electrically connected to said fault detector and said interrupter, said test device generating a test signal that is designed to determine if the fault detector is functioning properly;
   said test device monitoring the electrical signal in said interrupter such that the test signal is injected into the electrical signal on a falling edge of the electrical signal and at a point above 50% of a maximum amplitude of the electrical signal.

2. The circuit interrupting device of claim 1, wherein the test signal is injected into the electrical signal on a falling edge of the electrical signal and at a point above 54% of a maximum amplitude of the electrical signal.

3. The circuit interrupting device of claim 2, wherein the test signal is injected into the electrical signal on a falling edge of the electrical signal and at about 54.2% of a maximum amplitude of the electrical signal.

4. The circuit interrupting device of claim 1, wherein said line terminal comprises a power connection and a neutral connection and the electrical signal provided to said line terminal comprises single phase power.

5. The circuit interrupting device of claim 1, wherein said test device comprises a controller.

6. The circuit interrupting device of claim 5, wherein said controller comprises a microprocessor and said fault detector comprises a sense coil.

7. The circuit interrupting device of claim 6, wherein the test signal is based on an analog voltage divider of power from said power source and said comparator.

8. The circuit interrupting device of claim 7, wherein if a fault is detected, said controller determines if an alarm condition is triggered.

9. The circuit interrupting device of claim 8, further comprising an LED for generating a visual indication if an alarm condition is triggered.

10. The circuit interrupting device of claim 9, wherein said controller is programmable to change a time duration of LED indicating that an alarm condition has been triggered.

11. The circuit interrupting device of claim 8, wherein said controller is programmable to change a time for said interrupter to move to the open condition based on an identification of a fault condition.

12. The circuit interrupting device of claim 8, further comprising a Silicon Rectifier Diode (SCR), wherein a leakage current through said SCR is measured and if the leakage current measured exceeds a threshold value and said fault detector does not detect a fault, said controller determines that the device has reached end of life and generates an end of life signal.

13. The circuit interrupting device of claim 12, wherein the end of life signal activates an LED to provide a visual end of life indication.

14. The circuit interrupting device of claim 12, wherein the end of life signal activates said interrupter to place said interrupter in the open condition.

15. The circuit interrupting device of claim 14, wherein the end of life signal repeatedly activates said interrupter to place said interrupter in the open condition when a manual reset of the circuit interrupting device occurs.

16. The circuit interrupting device of claim 12, wherein the end of life signal is transmitted via a network to a remote location.

17. The circuit interrupting device of claim 16, wherein the end of life signal is wirelessly transmitted.

18. The circuit interrupting device of claim 12, wherein said test device performs the fault detection test within five seconds from when power is supplied to said fault detector.

19. A circuit interrupting device comprising:
   a line terminal including two power connections to be connected to a power source to provide electrical power, where the an electrical power provided to said line terminal comprises dual phase power;
   a load terminal configured to be connected to a load;
   an interrupter coupled between said line terminal and said load terminal, said interrupter having an open and a closed condition, wherein said interrupter electrically connects said line terminal to said load terminal in the closed condition and electrically disconnects said line terminal from said load terminal in the open condition;
   a fault detector configured to detect a fault in an electrical signal in said interrupter, wherein when a fault is detected said interrupter is placed in the open condition; and
   a test device electrically connected to said fault detector and said interrupter, said test device generating a test signal that is designed to determine if the fault detector is functioning properly;
   said test device monitoring the electrical signal in said interrupter such that the test signal is injected into the electrical signal on a falling edge of the electrical signal and at approximately 2.6V and in a range of from 0.8 ms to 0.9 ms from a minimum amplitude of the electrical signal.

20. The circuit interrupting device of claim 19, wherein the test signal is injected into the electrical signal on a falling edge of the electrical signal and at approximately 2.64V and at approximately 0.879 ms from a minimum amplitude of the electrical signal.

21. The circuit interrupting device of claim 19, wherein said test device comprises a controller.

22. The circuit interrupting device of claim 21, wherein said controller includes a timer, said controller measuring a leading edge of the electrical signal such that said timer begins incrementing at 50% of the maximum amplitude of the electrical signal.

23. The circuit interrupting device of claim 21, wherein said controller comprises a microprocessor and said fault detector comprises a sense coil.

24. The circuit interrupting device of claim 23, wherein the test signal is based on an analog voltage divider of power from said power source and said comparator.

25. The circuit interrupting device of claim 24, wherein if a fault is detected, said controller determines if an alarm condition is triggered.

26. The circuit interrupting device of claim 25, further comprising an LED for generating a visual indication if an alarm condition is triggered.

27. The circuit interrupting device of claim 26, wherein said controller is programmable to change a time duration of LED indicating that an alarm condition has been triggered.

28. The circuit interrupting device of claim 25, wherein said controller is programmable to change a time for said interrupter to move to the open condition based on an identification of a fault condition.

29. The circuit interrupting device of claim 25, further comprising a Silicon Rectifier Diode (SCR), wherein a leakage current through said SCR is measured and if the leakage current measured exceeds a threshold value and said fault detector does not detect a fault, said controller determines that the device has reached end of life and generates an end of life signal.

30. The circuit interrupting device of claim 29, wherein the end of life signal activates an LED to provide a visual end of life indication.

31. The circuit interrupting device of claim 29, wherein the end of life signal activates said interrupter to place said interrupter in the open condition.

32. The circuit interrupting device of claim 31, wherein the end of life signal repeatedly activates said interrupter to place said interrupter in the open condition when a manual reset of the circuit interrupting device occurs.

33. The circuit interrupting device of claim 29, wherein the end of life signal is transmitted via a network to a remote location.

34. The circuit interrupting device of claim 33, wherein the end of life signal is wirelessly transmitted.

35. The circuit interrupting device of claim 29, wherein said test device performs the fault detection test within five seconds from when power is supplied to said fault detector.

* * * * *